United States Patent
Chen (10) Patent No.: US 11,721,744 B2
(45) Date of Patent: Aug. 8, 2023

(54) METHOD OF MAKING A VERTICALLY-ALIGNED THREE DIMENSIONAL SEMICONDUCTOR STRUCTURE

(71) Applicant: HON HAI PRECISION INDUSTRY CO., LTD., New Taipei (TW)

(72) Inventor: Chung-Yi Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 86 days.

(21) Appl. No.: 17/555,427

(22) Filed: Dec. 18, 2021

(65) Prior Publication Data

US 2022/0199805 A1 Jun. 23, 2022

(30) Foreign Application Priority Data

Dec. 18, 2020 (CN) .......................... 202011505918.3

(51) Int. Cl.
*H01L 29/66* (2006.01)
*H01L 21/02* (2006.01)
*H01L 27/088* (2006.01)

(52) U.S. Cl.
CPC .... *H01L 29/66666* (2013.01); *H01L 29/6653* (2013.01); *H01L 29/66545* (2013.01); *H01L 21/0245* (2013.01); *H01L 21/02483* (2013.01); *H01L 21/02507* (2013.01); *H01L 21/02532* (2013.01); *H01L 21/02565* (2013.01); *H01L 21/02639* (2013.01)

(58) Field of Classification Search
CPC ..... H01L 21/823412; H01L 21/823487; H01L 21/823885; H01L 27/2454; H01L 27/088; H01L 29/78696; H01L 29/7827; H01L 29/66666; H01L 21/823418; H01L 29/66545; H01L 21/02507; H01L 21/02639; H01L 21/8221

See application file for complete search history.

(56) References Cited

U.S. PATENT DOCUMENTS

| 7,259,411 B1* | 8/2007 | Hopper | H01L 29/66666 |
| | | | 257/E29.022 |
| 10,403,638 B2* | 9/2019 | Lee | H01L 29/7827 |
| 10,971,490 B2* | 4/2021 | Zhou | H01L 21/8221 |

(Continued)

*Primary Examiner* — Maliheh Malek
*Assistant Examiner* — Sandra Milena Rodriguez Villanu
(74) *Attorney, Agent, or Firm* — ScienBiziP, P.C.

(57) ABSTRACT

A method for making a three-dimensional semiconductor structure includes: providing a substrate, forming a first insulating layer on the substrate, and defining at least one channel hole in the first insulating layer; forming a first epitaxial layer in each channel hole and forming a second epitaxial layer stacked on the first epitaxial layer; forming a sacrificial layer on the first insulating layer and exposing the second epitaxial layer relative to the sacrificial layer, forming another first epitaxial layer on the second epitaxial layer; forming a second insulating layer on the sacrificial layer, and forming another second epitaxial layer stacking on the another first epitaxial layer; repeating to form a plurality of sacrificial layers and a plurality of second insulating layers alternately stacked on the first insulating layer, and repeating to form a plurality of first epitaxial layers and a plurality of second epitaxial layers alternately stacked on the substrate.

13 Claims, 13 Drawing Sheets

(56) References Cited

U.S. PATENT DOCUMENTS

| | | | |
|---|---|---|---|
| 2015/0104916 A1* | 4/2015 | Lee | H10B 43/20 |
| | | | 438/268 |
| 2015/0155297 A1* | 6/2015 | Eom | H01L 29/40117 |
| | | | 438/268 |
| 2016/0056169 A1* | 2/2016 | Lee | H10B 99/00 |
| | | | 438/269 |
| 2019/0097024 A1* | 3/2019 | Li | H01L 21/823487 |

* cited by examiner

METHOD OF MAKING A VERTICALLY-ALIGNED THREE DIMENSIONAL SEMICONDUCTOR STRUCTURE

FIELD

The subject matter herein generally relates to a method of making a three-dimensional semiconductor structure.

BACKGROUND

Semiconductor devices need to be highly integrated in order to meet the consumers' demand for microelectronics with high performance and low manufacturing cost. A degree of integration of a typical two-dimensional or planar semiconductor structure is mainly determined by an area occupied by the unit storage unit, and the integration degree is limited by technical ability to form fine patterns. Three-dimensional semiconductor structures have better performances and degrees of integration compared with two-dimensional semiconductor structures.

A three-dimensional semiconductor structure generally includes a plurality of stacked layers which may include a plurality of three-dimensional vertical transistors. In a conventional three-dimensional semiconductor structure, the stacked layers are etched to form a channel hole, and a semiconductor material is infilled in the channel hole to form a drain region and a source region of a three-dimensional vertical transistor. However, the channel holes are relatively slender, even a small skew and offset can prevent perfect uprightness in such holes, resulting in vertical misalignment of the drain region, the source region, and the gate region of the transistor.

BRIEF DESCRIPTION OF THE DRAWINGS

Implementations of the present technology will now be described, by way of embodiments only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

Figure 1:
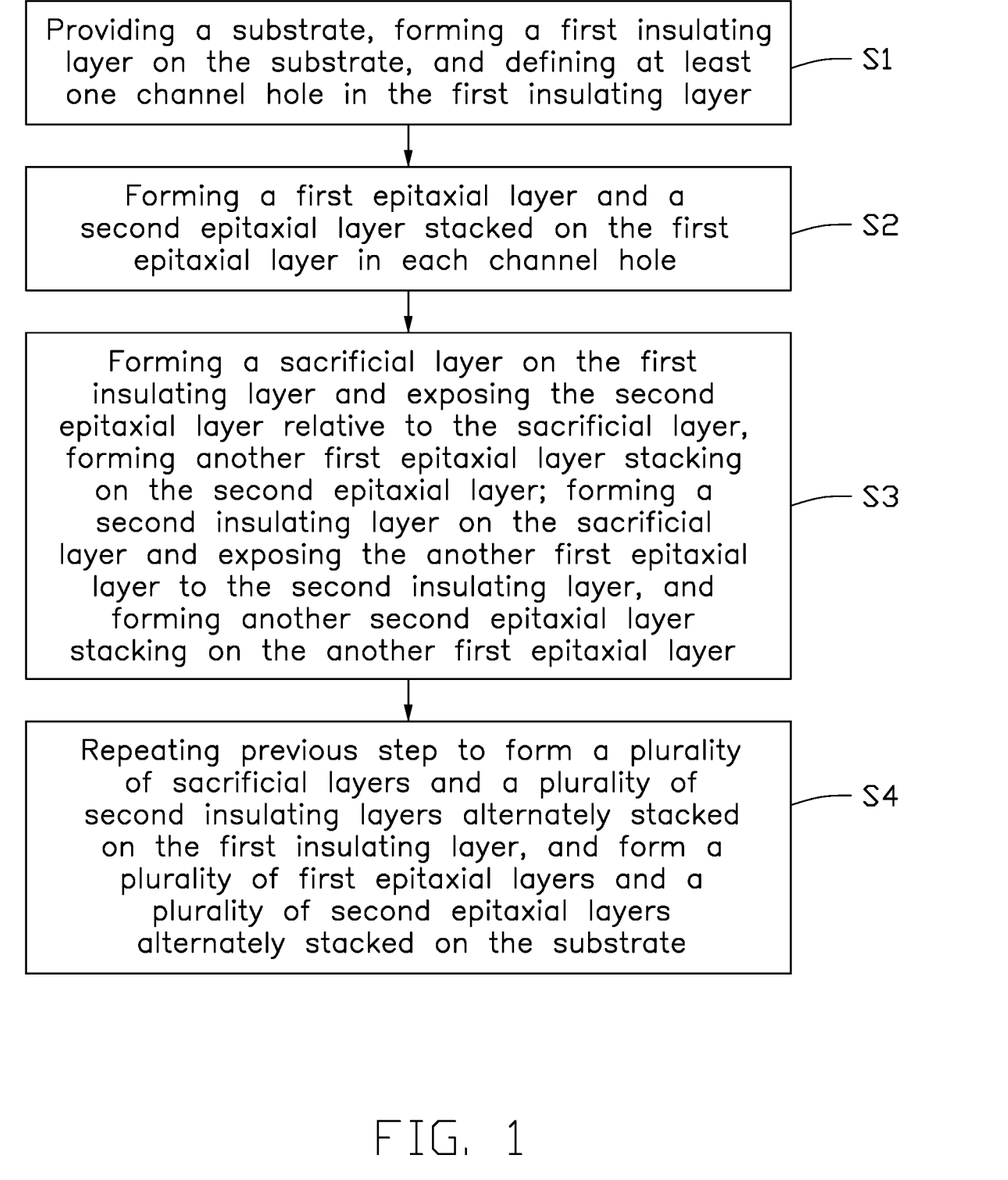
FIG. 1 is a flowchart of a method for making a three-dimensional semiconductor structure according to an embodiment of the present disclosure.

Referring to FIG. 1, a method of making a three-dimensional semiconductor structure provided by the embodiment of the present disclosure includes steps S1 to step S4.

Step S1: providing a substrate, forming a first insulating layer on the substrate, and defining at least one channel hole in the first insulating layer. Each channel hole extends through the first insulating layer to expose the substrate.

Step S2: sequentially stacking in each channel hole a first epitaxial layer which is doped non-uniformly and a second epitaxial layer. The first epitaxial layer is used to form a source region or a drain region.

Step S3: forming a sacrificial layer on the first insulating layer and exposing the second epitaxial layer to the sacrificial layer, and stacking another first epitaxial layer on the second epitaxial layer. A second insulating layer is formed on the sacrificial layer and the topmost first epitaxial layer is exposed to the second insulating layer, another second epitaxial layer is formed on the topmost first epitaxial layer.

Step S4: repeating the step S3 to totally form a plurality of sacrificial layers and a plurality of second insulating layers stacked alternately on the first insulating layer, and form a plurality of first epitaxial layers and a plurality of second epitaxial layers stacked alternately on the substrate.

Figure 2:
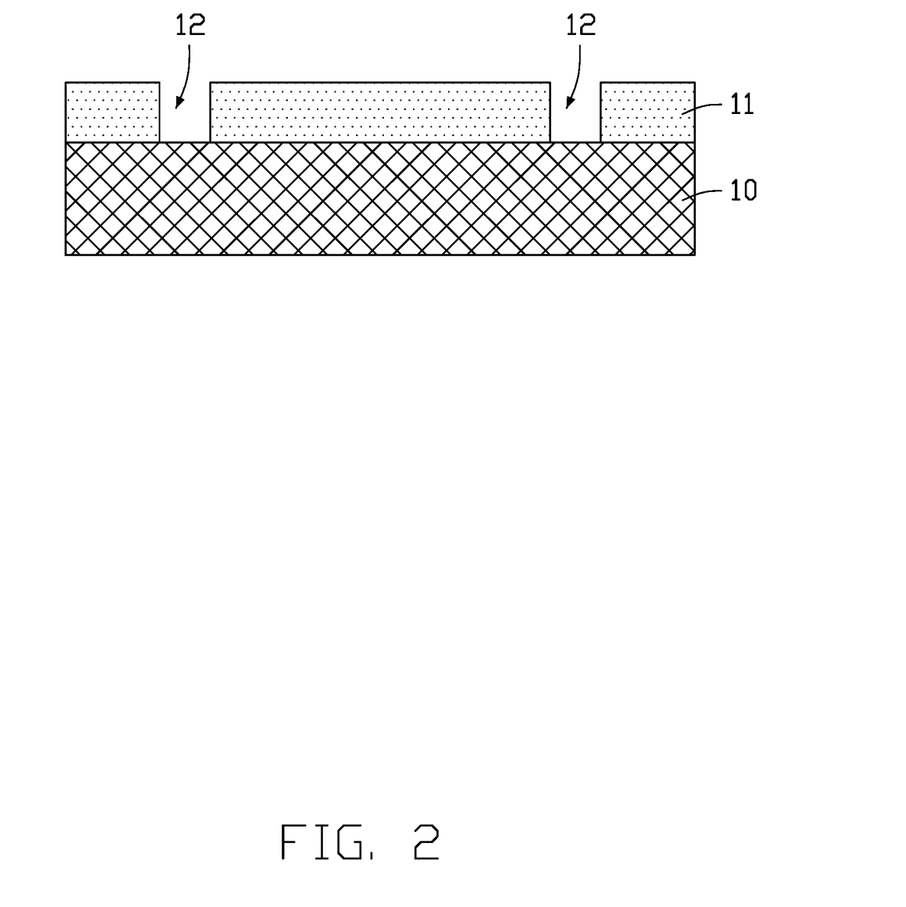
FIG. 2 is a cross-sectional view showing forming a first insulating layer on the substrate during the method for making a three-dimensional semiconductor structure.

In step S1, as shown in FIG. 2, the first insulating layer 11 is deposited on the substrate 10, and at least one channel hole 12 is defined in the first insulating layer 11. Each channel hole 12 extends through the first insulating layer 11 and exposes the substrate 10.

In the present embodiment, the first insulating layer 11 is patterned by a photoetching process to form at least one channel hole 12. The etching can be dry etching or wet etching. The substrate 10 may be, but is not limited to, a monocrystalline silicon substrate, a monocrystalline germanium substrate, or a monocrystalline silicon-germanium substrate. The first insulating layer 11 is an insulating material, which can be, but is not limited to, $SiO_2$.

Figure 3:
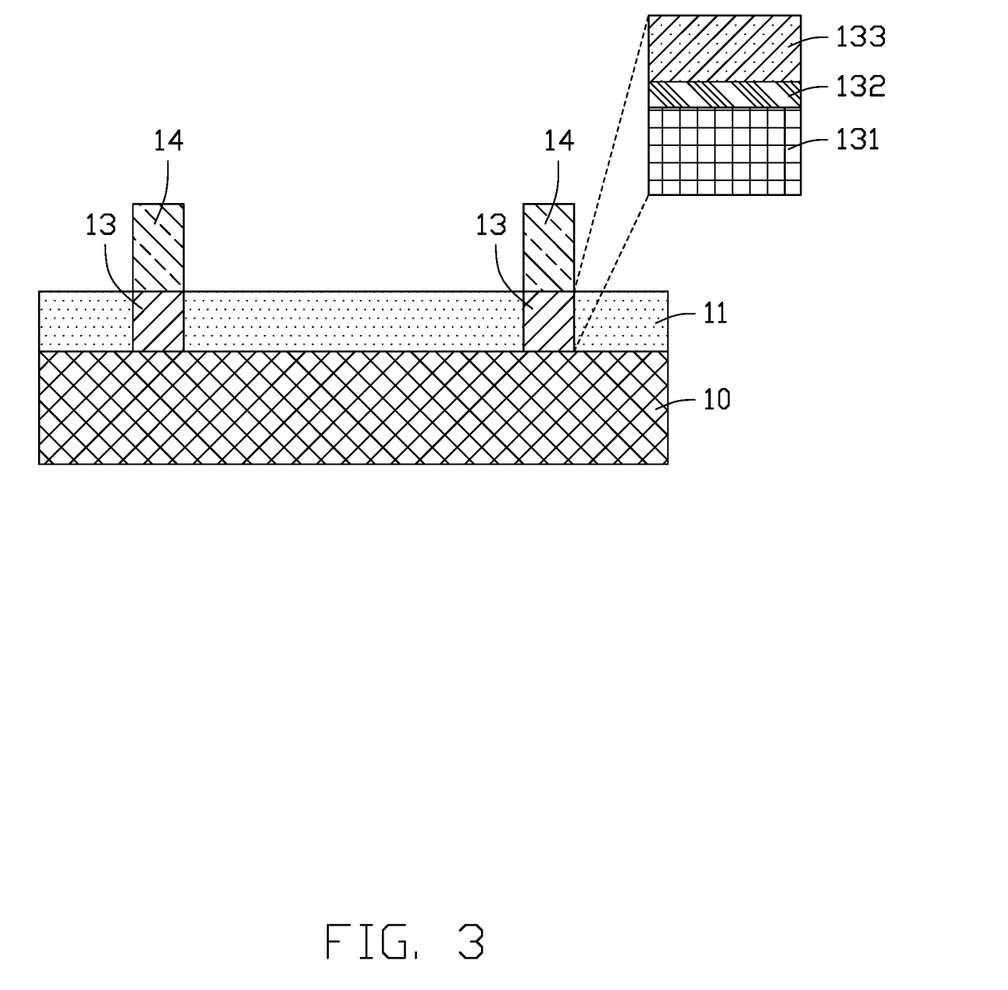
FIG. 3 is a cross-sectional view showing forming a first epitaxial layer and a second epitaxial layer during the method.

In step S2, as shown in FIG. 3, the first epitaxial layer 13 and the second epitaxial layer 14 are successively stacked in each channel hole 12. Specifically, the first epitaxial layer 13 is grown on the substrate 10 and in the channel hole 12 by a selective epitaxial growth process, and the first epitaxial layer 13 is basically flush with the first insulating layer 11. Then, the second epitaxial layer 14 is grown on the first epitaxial layer 13 by a selective epitaxial growth process, and the second epitaxial layer 14 is stacked on the first epitaxial layer 13 to form a vertical structure. The second epitaxial layer 14 protrudes from the channel hole 12.

In this embodiment, the first epitaxial layer 13 and the second epitaxial layer 14 are composed of semiconductor materials, which can be one or more selected from silicon, germanium, silicon-germanium, and indium-gallium-zinc oxide. The first epitaxial layer 13 may be an unevenly doped semiconductor material layer including two lightly doped semiconductor layers and one heavily doped semiconductor layer, and the heavily doped semiconductor layer is located between the two lightly doped semiconductor layers. The first epitaxial layer is used to form a source region or a drain region. The second epitaxial layer 14 is a lightly doped semiconductor layer for forming a channel region under the gate region. The first epitaxial layer 13 and the second epitaxial layer 14 may be different types of semiconductor layers, such as N-type semiconductor layers, P-type semiconductor layers, or homogeneous semiconductor layers. In this embodiment, one second epitaxial layer 14 and two first epitaxial layers 13 on both ends of the second epitaxial layer 14 belong to one transistor 19. Specifically, the gate region of the transistor 19 includes the second epitaxial layer 14, and the source region or the drain region of the transistor 19 each include one of the two first epitaxial layers 13. Since the first epitaxial layer 13 and the second epitaxial layer 14 are stacked vertically, the source region and drain region of the transistor 19 can also be stacked vertically.

In one embodiment, the step of stacking the first epitaxial layer 13 and the second epitaxial layer 14 includes successively forming the first epitaxial layer 13 of an uneven N-type doped semiconductor material and the second epitaxial layer 14 of a P-type or N-type lightly doped semiconductor material. In this embodiment, the step of forming the first epitaxial layer 13 of an N-type unevenly doped semiconductor material includes successively forming an N-type lightly doped first semiconductor material layer 131, an N-type heavily doped second semiconductor material layer 132, and an N-type lightly doped third semiconductor material layer 133, as shown in FIG. 3. In a modified embodiment, the step of forming the first epitaxial layer 13 of an N-type unevenly doped semiconductor material includes successively forming a P-type lightly doped first semiconductor material layer 131, an N-type heavily doped second semiconductor material layer 132, and a P-type lightly doped third semiconductor material layer 133. The N-type dopant of the N-type heavily doped second semiconductor material layer 132 diffuses to both the first semiconductor material layer 131 and the third semiconductor material layer 133 to form the first epitaxial layer 13 of uneven N-type doped semiconductor material. In the above embodiments, the first semiconductor material layer 131, the third semiconductor material layer 133, and the second epitaxial layer 14 are lightly doped, the dopant can be, but is not limited to, phosphorus, boron, or indium. The second semiconductor material layer 132 is heavily doped, and the dopant can be, but is not limited to, phosphorus, nitrogen, or arsenic. In the above embodiments, each second epitaxial layer 14 and two first epitaxial layers 13 on both ends of the second epitaxial layer 14 belong to one same N-type transistor 191. When the first epitaxial layer 13 of the uneven N-type doped semiconductor material formed by this method constitutes the source region or the drain region of the N-type transistor 191, the resistance of the source region or drain region of the N-type transistor 191 are reduced.

In another embodiment, the step of stacking the first epitaxial layer 13 and the second epitaxial layer 14 includes successively forming the first epitaxial layer 13 of a P-type unevenly doped semiconductor material and the second epitaxial layer 14 of a P-type or N-type lightly doped semiconductor material. In this embodiment, the step of forming the first epitaxial layer 13 of a P-type unevenly doped semiconductor material includes successively forming a P-type lightly doped first semiconductor material layer 131, a P-type heavily doped second semiconductor material layer 132, and a P-type lightly doped third semiconductor material layer 133, as shown in FIG. 3. In another embodiment, the step of forming the first epitaxial layer 13 of a P-type unevenly doped semiconductor material includes successively forming an N-type lightly doped first semiconductor material layer 131, a P-type heavily doped second semiconductor material layer 132, and an N-type lightly doped third semiconductor material layer 133. The P-type dopant of the P-type heavily doped second semiconductor material layer 132 diffuses to both the first semiconductor material layer 131 and the third semiconductor material layer 133. In the above embodiments, the first semiconductor material layer 131, the third semiconductor material layer 133, and the second epitaxial layer 14 are lightly doped, the dopant can be, but is not limited to, phosphorus, boron, or indium. The second semiconductor material layer 132 is heavily doped, the dopant can be, but is not limited to, phosphorus, nitrogen, or arsenic. In the above embodiments, each second epitaxial layer 14 and two first epitaxial layers 13 on both ends of the second epitaxial layer 14 belong to one P-type transistor 192. When the first epitaxial layer 13 of the unevenly-doped P-type semiconductor material formed by this method constitutes the source region or the drain region of the P-type transistor 192, the resistance of the source region or drain region of the P-type transistor 192 is reduced.

The step S3 is shown in FIG. 4A to FIG. 4F.

Figure 4A:
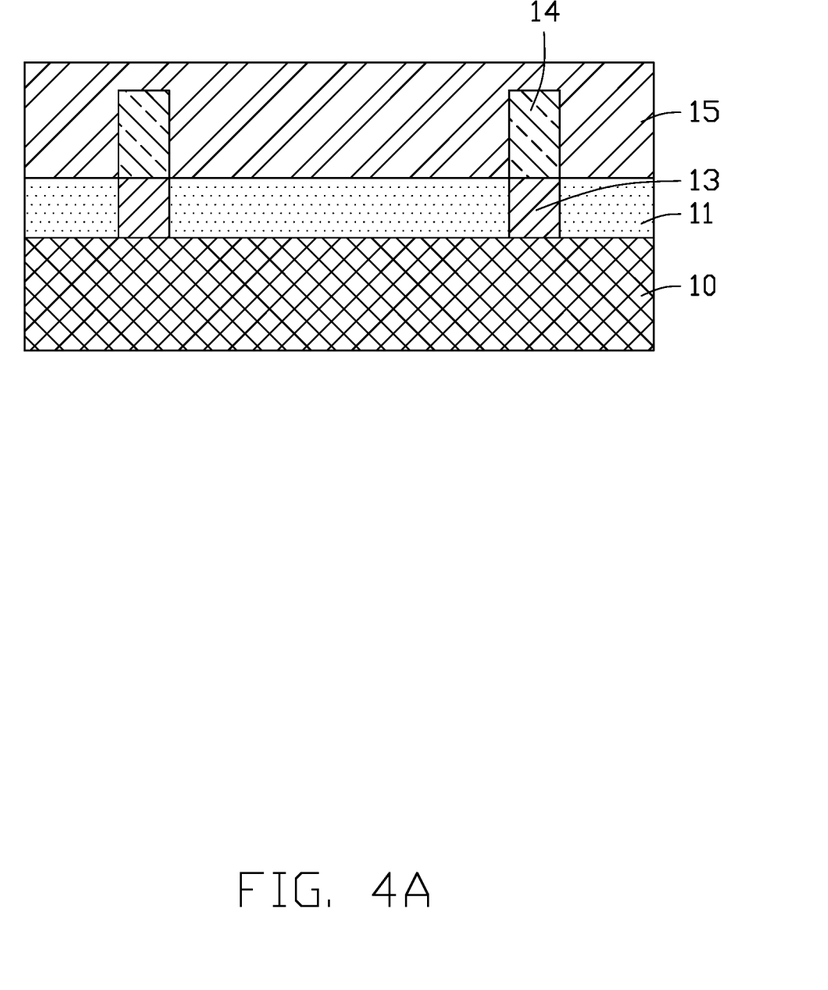
FIG. 4A is a cross-sectional view showing forming a sacrificial layer covering the second epitaxial layer on the first insulating layer.
Figure 4B:
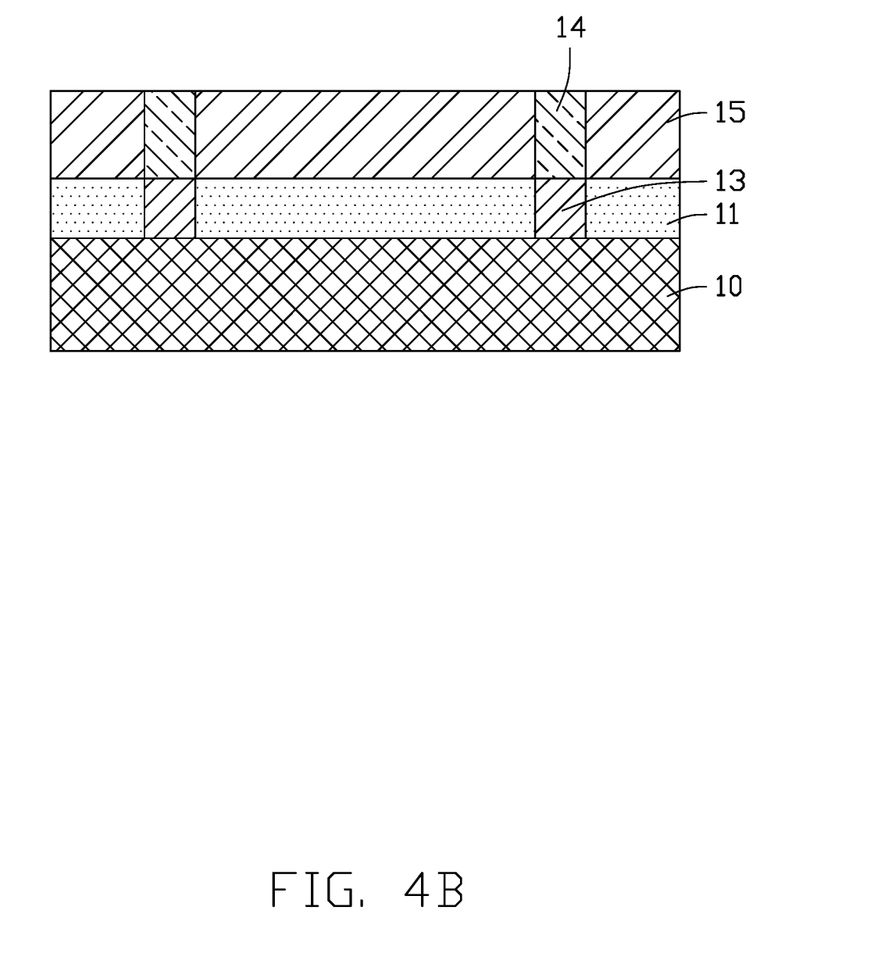
FIG. 4B is a cross-sectional view showing the sacrificial layer flattened.

As shown in FIGS. 4A and 4B, the step of forming the sacrificial layer 15 on the first insulating layer 11 includes: depositing the sacrificial layer 15 on the first insulating layer 11 to cover the second epitaxial layer 14; flattening the sacrificial layer 15 (reducing a thickness of the sacrificial layer 15) so that the second epitaxial layer 15 is exposed to the sacrificial layer 15.

Figure 4C:
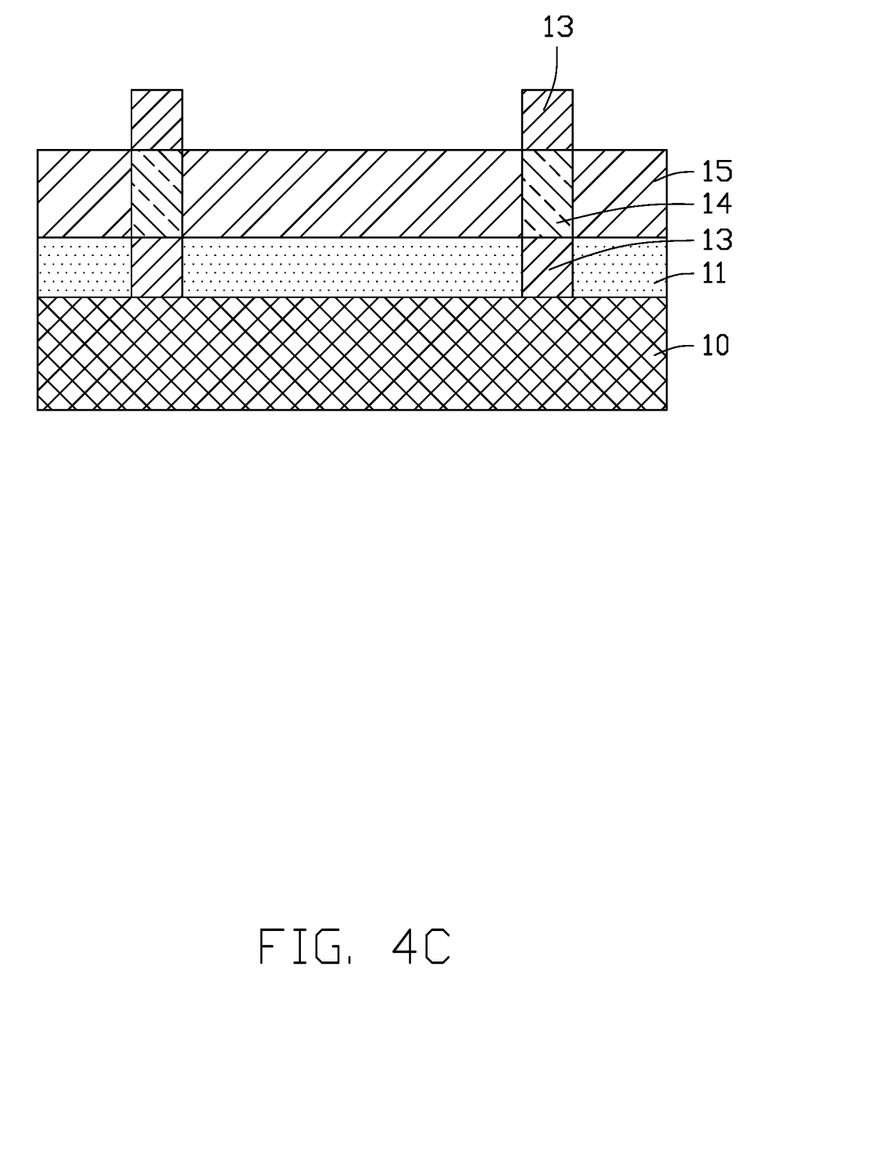
FIG. 4C is a cross-sectional view showing another first epitaxial layer being grown on the second epitaxial layer.

As shown in FIG. 4C, another first epitaxial layer 13 is formed on the second epitaxial layer 14. In this embodiment, another first epitaxial layer 13 is formed by a selective epitaxial growth process on the second epitaxial layer 14, and the another first epitaxial layer 13 which is stacked on the second epitaxial layer 14 becomes the topmost layer.

Figure 4D:
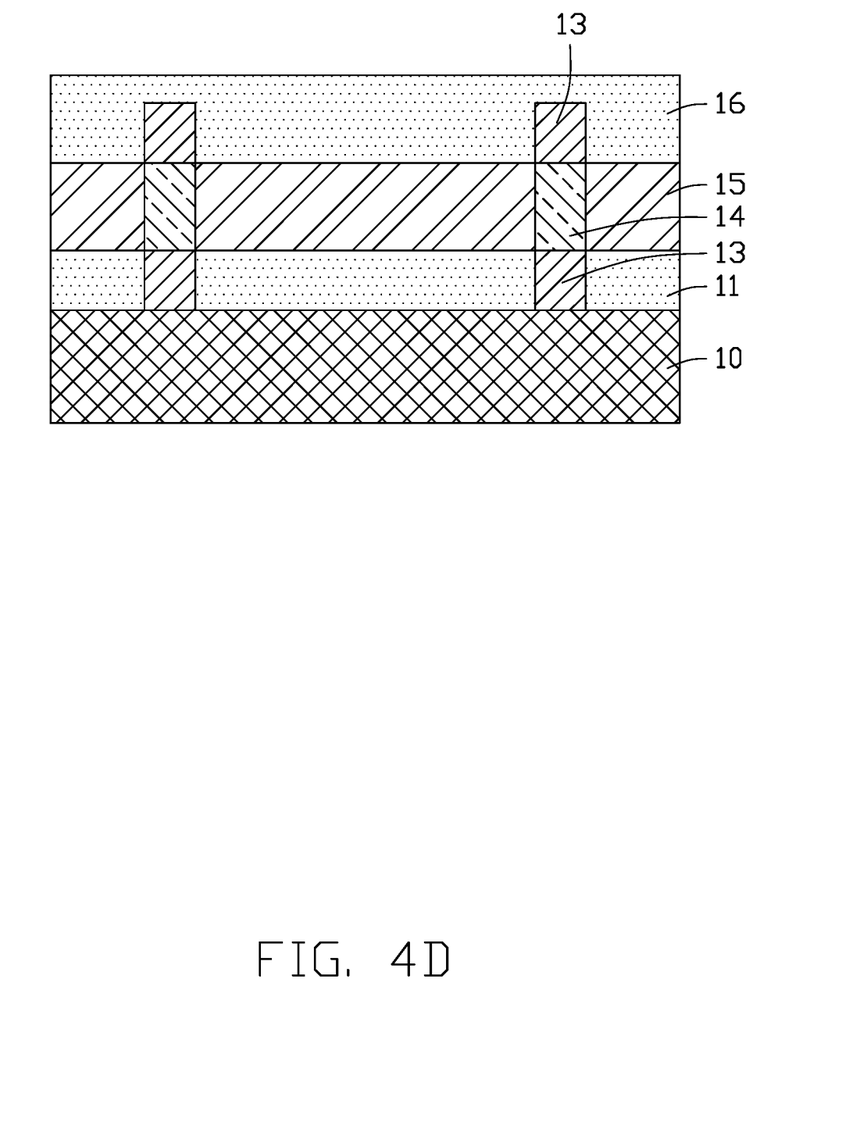
FIG. 4D is a cross-sectional view showing a second insulating layer formed and covering the another first epitaxial layer on the sacrificial layer.
Figure 4E:
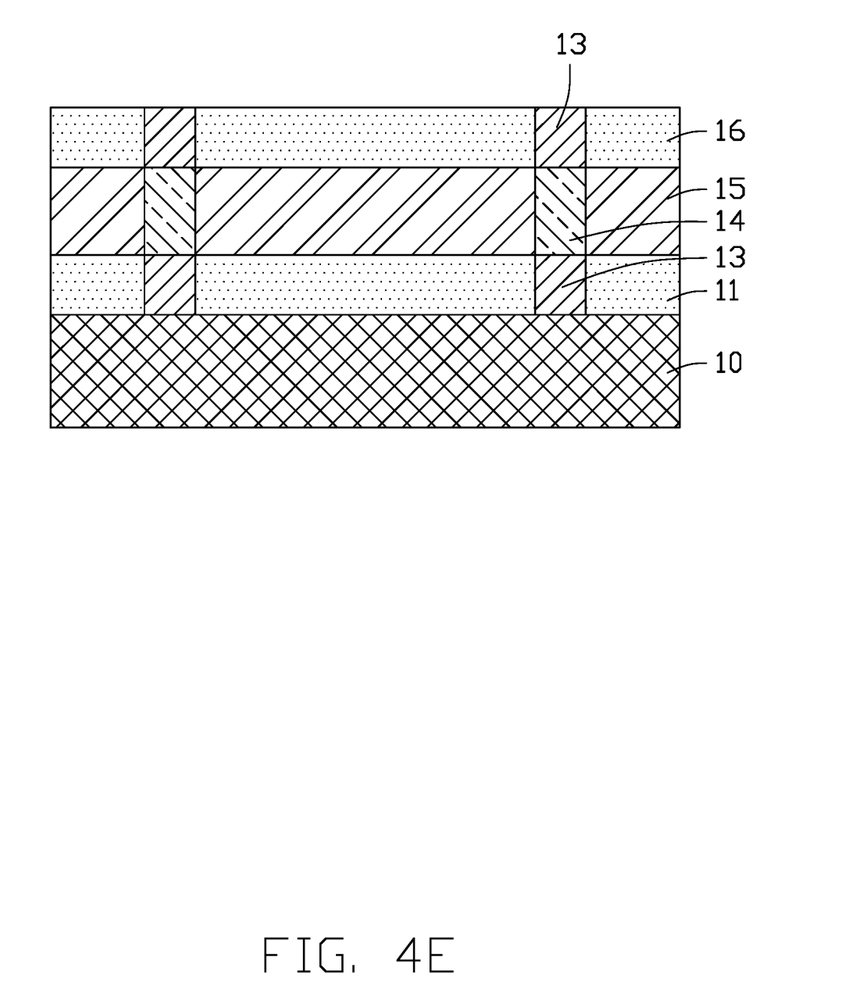
FIG. 4E is a cross-sectional view showing the second insulating layer flattened.

As shown in FIG. 4D and FIG. 4E, the step of forming the second insulating layer 16 on the sacrificial layer 15 includes: depositing the second insulating layer 16 on the sacrificial layer 15 to completely cover the topmost first epitaxial layer 13; and flattening the second insulating layer 16 (reducing a thickness of the second insulating layer 16) so that the now-topmost first epitaxial layer 13 is exposed to the second insulating layer 16.

Figure 4F:
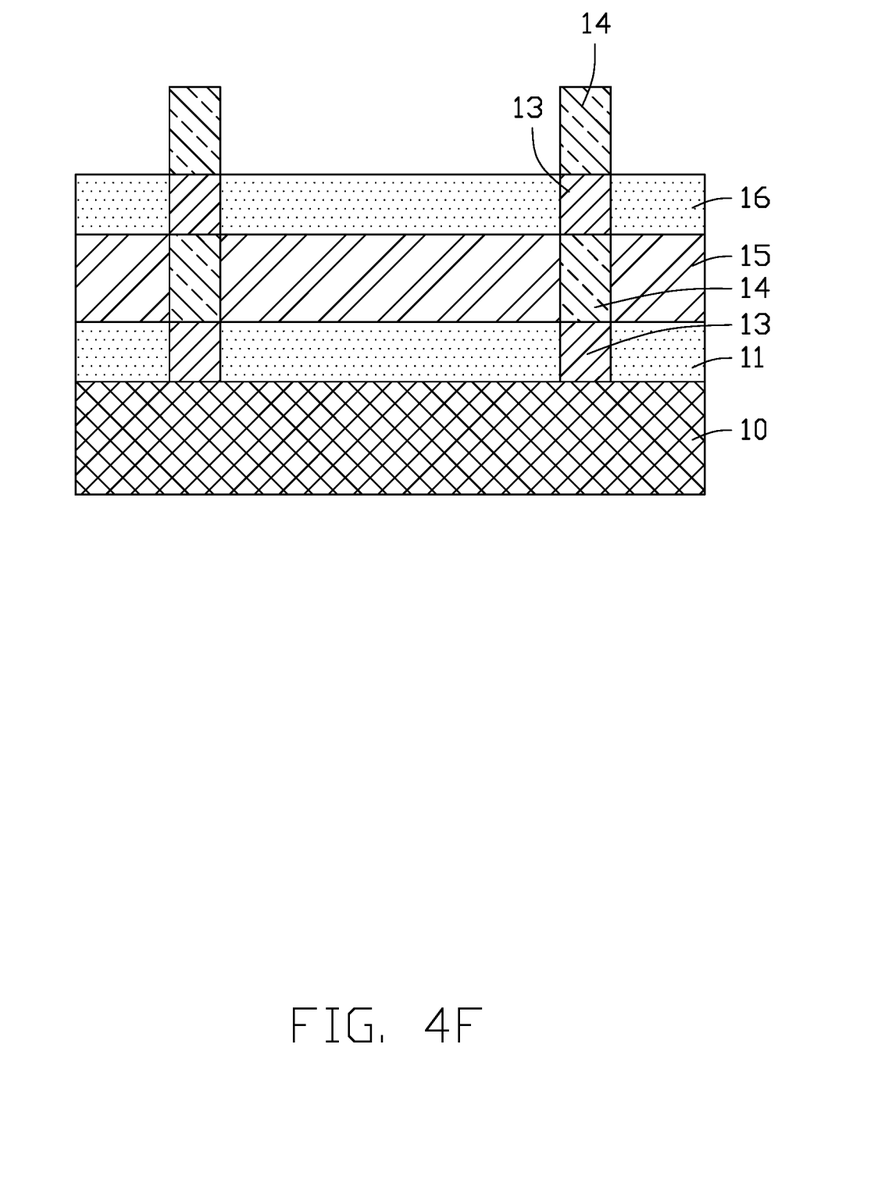
FIG. 4F is a cross-sectional view showing another second epitaxial layer formed on the another first epitaxial layer.

As shown in FIG. 4F, another second epitaxial layer 14 is formed on the another first epitaxial layer 13 by a selective epitaxial growth process. The another first epitaxial layer 13 and the another second epitaxial layer 14 are stacked vertically, and both the another first epitaxial layer 13 and the another second epitaxial layer 14 are stacked vertically with the first epitaxial layer 13 and the second epitaxial layer 14 formed in the step S1.

In this embodiment, the second insulating layer 16 and the sacrificial layer 15 are flattened by chemical mechanical polishing (CMP). In one embodiment, if the second insulating layer 16 and the sacrificial layer 15 are formed by an area selective deposition (ASD) process, the CMP flattening step may be omitted.

Figure 5:
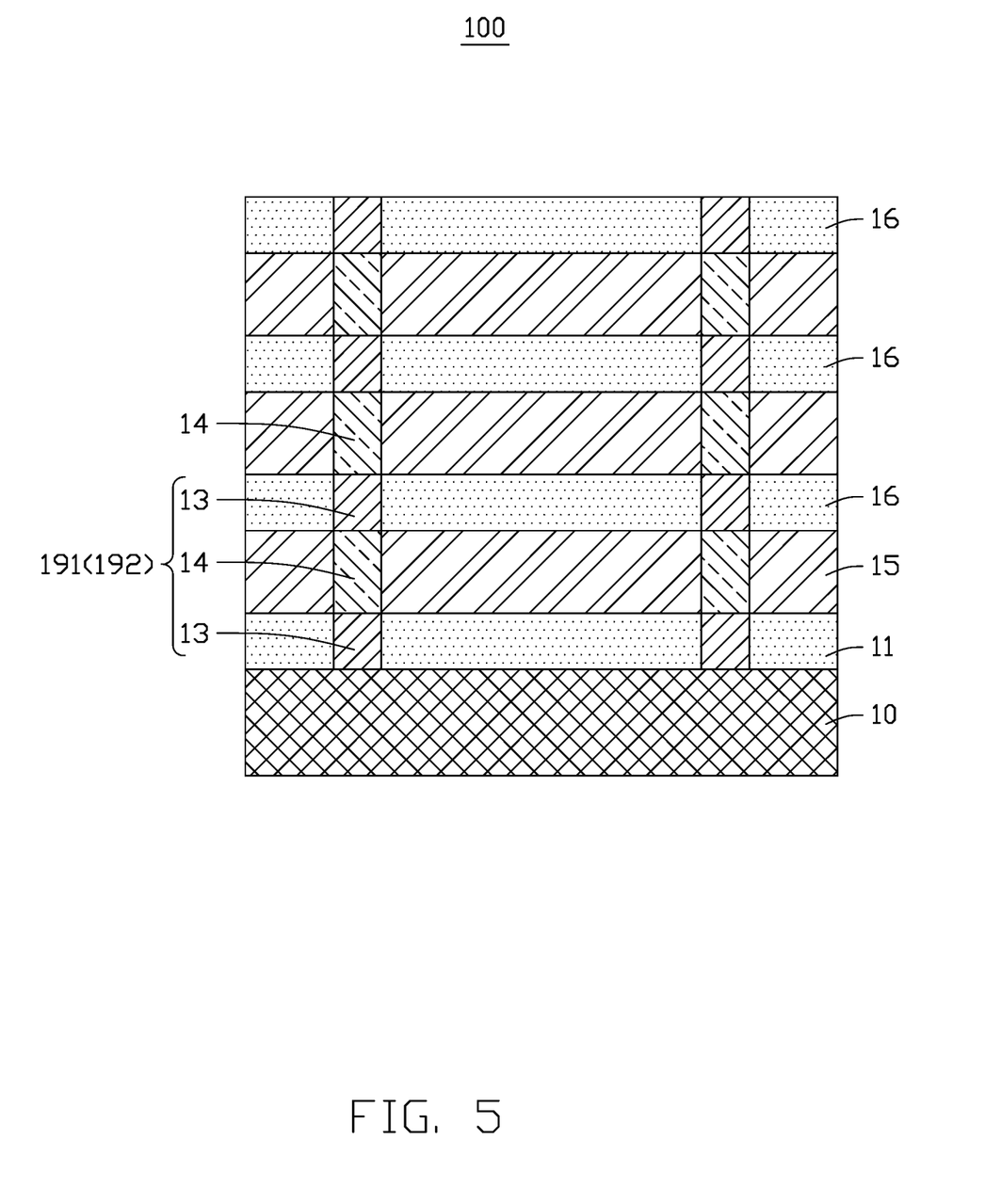
FIG. 5 is a cross-sectional view showing a plurality of second insulating layers, a plurality of first epitaxial layers, and a plurality of second epitaxial layers formed.

The step S4 is shown in FIG. 5. When the steps S1, S2, and S3 are completed and the step S3 is repeated, another sacrificial layer 15 is deposit on the second insulating layer 16 formed in the step S3, the another sacrificial layer 15 is flattened to expose the another second epitaxial layer 14 formed in the step S3 to the another sacrificial layer 15. The another first epitaxial layer 13 is grown on the another second epitaxial layer 14 by a selective epitaxial growth process, and the another first epitaxial layer 13 is stacked on the another second epitaxial layer 14.

Thus, the first insulating layer 11 is located on the substrate 10, then the plurality of second insulating layers 16 and the plurality of sacrificial layers 15 are alternately stacked on the first insulating layer 11. The plurality of first epitaxial layers 13 and the plurality of second epitaxial layers 14 are alternately stacked on the substrate 10. The first epitaxial layers 13 and the second epitaxial layers 14 extend through the first insulating layer 11, the second insulating layers 16, and the sacrificial layers 15.

In one embodiment, the first epitaxial layers 13 and the second epitaxial layers 14 located in different layers form a plurality of stacked P-type transistors 192 and/or a plurality of stacked N-type transistors 191. Specifically, the plurality of N-type transistors 191 form a first stacked region, the plurality of P-type transistors 192 form a second stacked region, and the first stacked region and the second stacked region are separated by an insulating layer.

The method of making the three-dimensional semiconductor structure further includes: after the step S4, defining a gate hole 17 in the second insulating layers 16 and the sacrificial layers 15, the gate hole 17 extending through the second insulating layers 16 and the sacrificial layers 15 to expose the first insulating layer 11; then, removing all of the sacrificial layers 15 and filling conductive material in the gate hole 17 and a region previously occupied by all of the sacrificial layers 15 to form a gate 21. This step is shown in FIG. 6A to FIG. 6C.

Figure 6A:
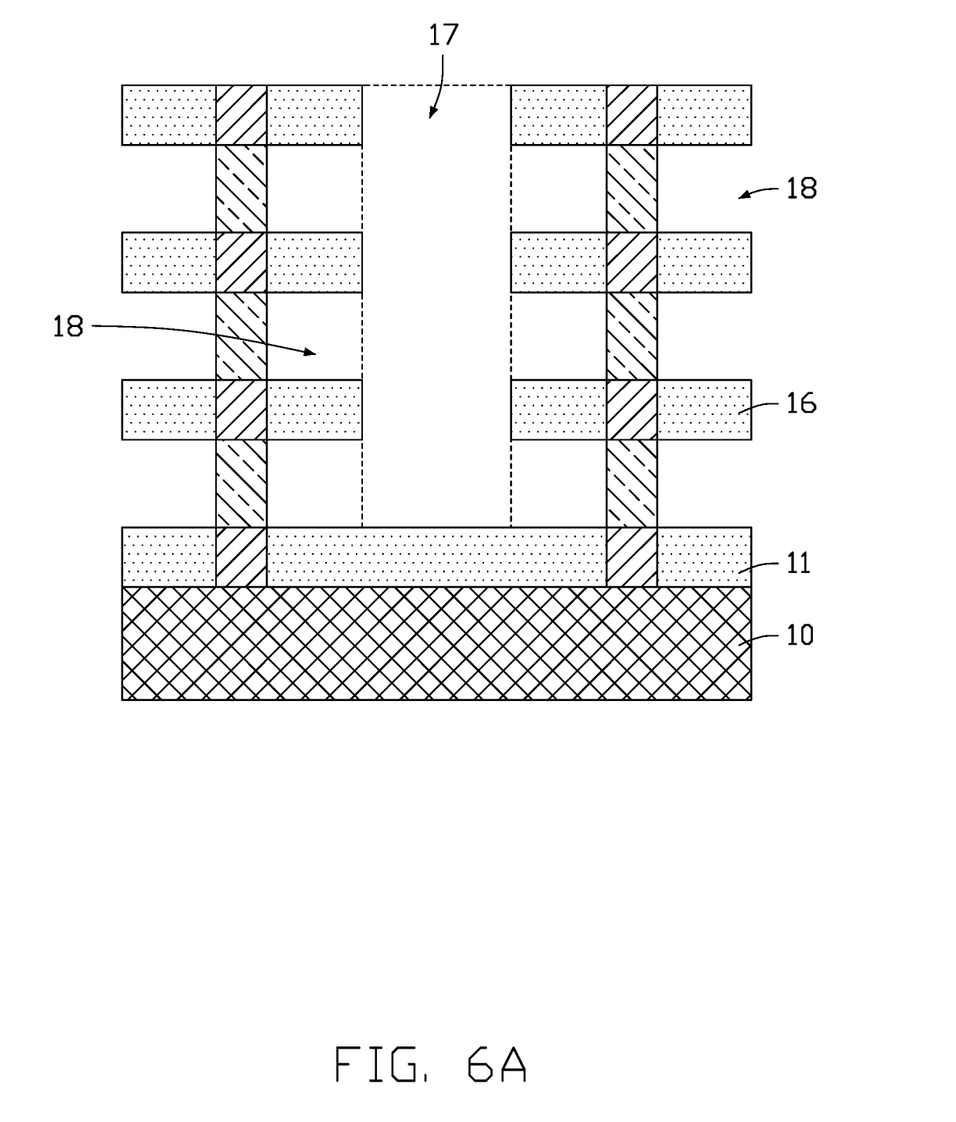
FIG. 6A is a cross-sectional view showing a gate hole and gate channels formed.

As shown in FIG. 6A, the second insulating layers 16 and the sacrificial layers 15 alternately stacked are patterned by a photoetching method to form the gate hole 17. The sacrificial layers 15 are removed to form the gate channel 18 by etching from the gate hole 17. In this embodiment, under the same etching conditions, an etching rate of each sacrificial layer 15 is higher than that of the first insulating layer 11 and the second insulating layer 16. That is, an etching selection ratio of each sacrificial layer 15 to the first insulating layer 11 is greater than 1, and the etching selection ratio of each sacrificial layer 15 to each second insulating layer 16 is also greater than 1. Thus, the first insulating layer 11 and each second insulating layer 16 are retained when the sacrificial layers 15 are removed. Each second insulating layer 16 and the first insulating layer 11 are made of insulating materials, and each sacrificial layer 15 can be made of insulating material or non-insulating material. In one embodiment, the first insulating layer 11 and each second insulating layer 16 are made of $SiO_2$, and each sacrificial layer 15 is made of silicon nitride.

Figure 6B:
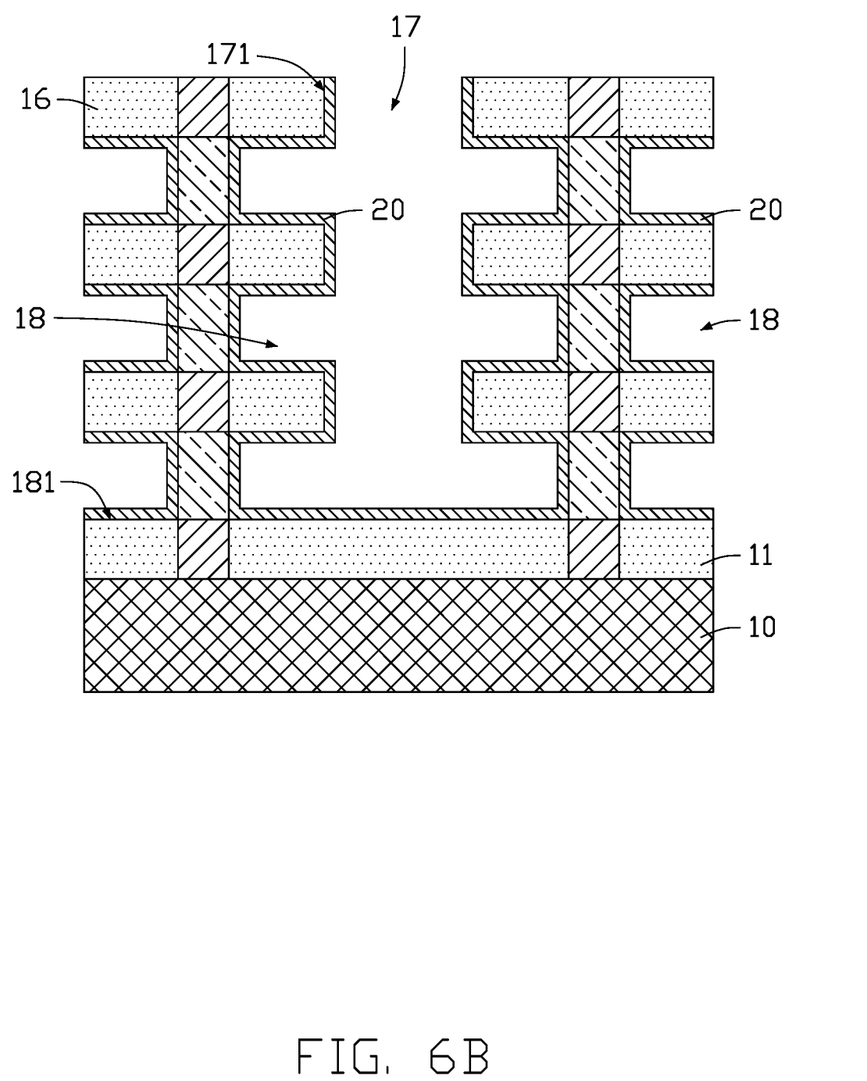
FIG. 6B is a cross-sectional view showing a dielectric layer formed.

As shown in FIG. 6B, after removing the sacrificial layers 15 and before forming the gate 21, the method of making the three-dimensional semiconductor further includes: forming the gate channel 18 by removing the sacrificial layers 15, and forming a thin dielectric layer 20 on sidewalls 181 of the first insulating layer 11 and the second insulating layers 16 in contact with the gate channel 18 and the gate hole 17.

Figure 6C:
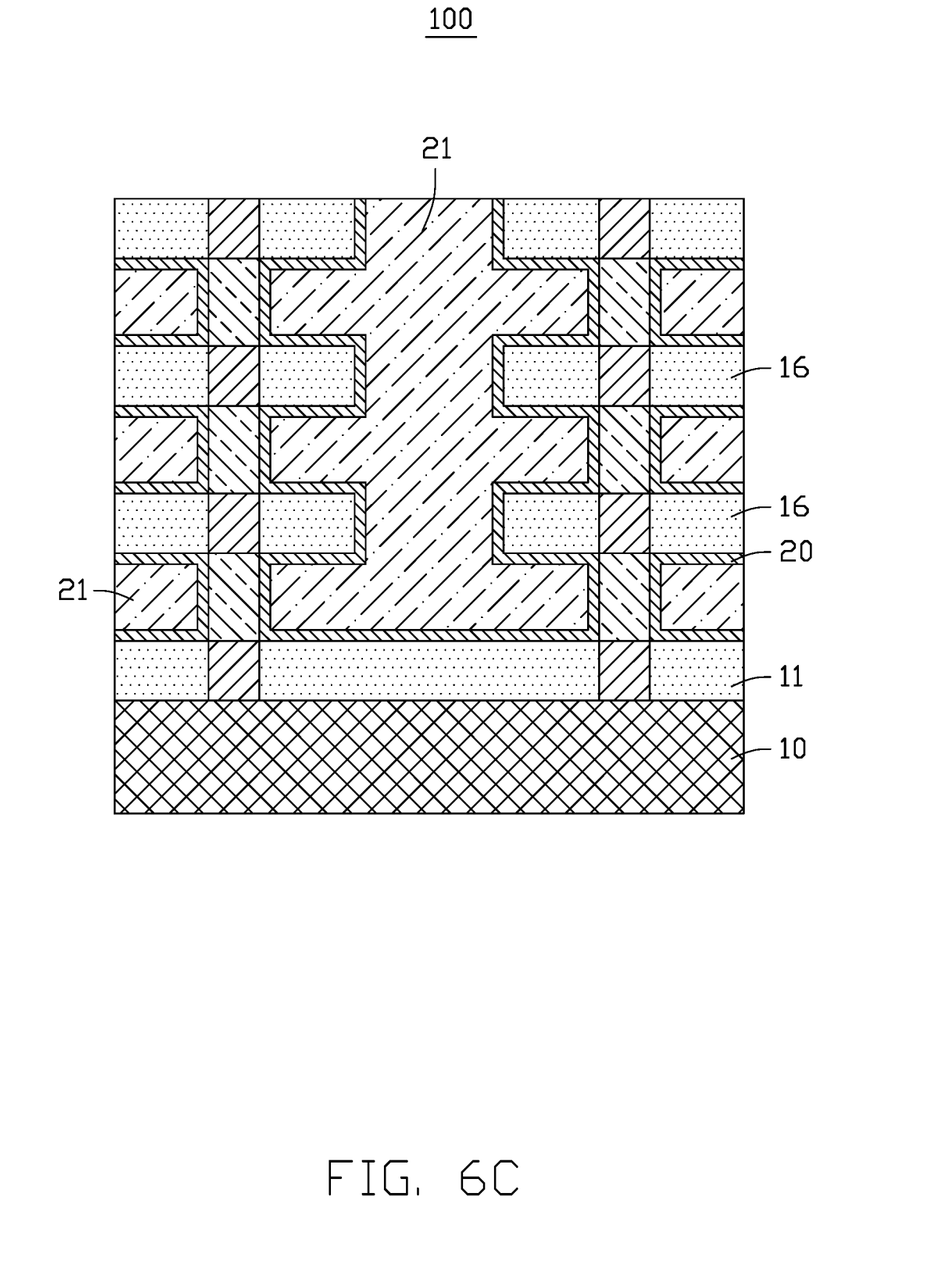
FIG. 6C is a cross-sectional view showing a gate formed.

As shown in FIG. 6C, conductive material is infilled in the gate channel 18 and the gate hole 17 to form a gate 21 after forming the dielectric layer 20. In this embodiment, the dielectric layer 20 is made of an insulating material, which can be, but is not limited to, $SiO_2$ or SiN. The conductive material forming the gate 21 may be, but is not limited to, at least one doped semiconductor (doped silicon, doped germanium, etc.), conductive metal nitrides (titanium nitride, tantalum nitride, etc.), and metals or metal-semiconductor compounds (tungsten silicide, cobalt silicide, titanium silicide, etc.).

In this embodiment, the dielectric layer 20, the first insulating layer 11, each second insulating layer 16, and each sacrificial layer 15 can be formed by one or more film deposition processes, including but not limited to chemical vapor deposition (CVD), physical vapor deposition (PVD), atomic layer deposition (ALD), spin coated dielectric material (SOD) or any combination thereof.

In one embodiment, the second insulating layer 16 is formed as a final step.

In the method of making the three-dimensional semiconductor structure, it is not necessary to define channel holes extending through the first insulating layer 11 and the second insulating layers 16, neither is it necessary to form first epitaxial layers 13 and second epitaxial layers 14 in the channel holes. Instead, only the channel hole 12 extending through the first insulating layer 11 is formed, and a first epitaxial layer 13 and a second epitaxial layer 14 are formed in the channel hole 12. Subsequently, another first epitaxial layer 13 is directly grown on the second epitaxial layer 14, and another second epitaxial layer 14 is directly grown on the topmost first epitaxial layer 13. The laminations of the first epitaxial layers 13 and the second epitaxial layers 14 allow an upright and non-skewed structure to be formed. Even with the addition of the second insulating layers 16, the first epitaxial layers 13 and the second epitaxial layers 14 formed by the method maintain alignment with each other, so that the first epitaxial layers 13 and the second epitaxial layers 14 are vertical and are not skewed structures.

In the three-dimensional semiconductor structure, the first epitaxial layer 13 can be used as a source region or a drain region, and the unevenly doped first epitaxial layer 13 is formed by a selective growth process. This reduces the resistance value of the source region or the drain region, and the three-dimensional semiconductor structure which includes a plurality of stacked layers maintains a lower serially connected resistance value of the source region and the drain region. Thus, the working current of the transistor can be increased, and the response speed of the transistor improved. In this embodiment, since the first epitaxial layers 13 and the second epitaxial layers 14 of semiconductor material are formed by a selective epitaxial growth process, and the formation of the first epitaxial layers 13 and the second epitaxial layers 14 is not limited by the channel holes 12, the size of the channel holes 12 can be reduced to a certain extent.

The disclosure also provides the three-dimensional semiconductor structure 100 itself, prepared by the above-described method. The three-dimensional semiconductor structure 100 may be a memory, including a dynamic random access memory and a static random access memory. The three-dimensional semiconductor structure 100 can also function as a complementary metal oxide semiconductor.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method of making a three-dimensional semiconductor structure, comprising:
    providing a substrate, forming a first insulating layer on the substrate, and defining at least one channel hole in the first insulating layer, wherein each channel hole extends through the first insulating layer and exposes the substrate;
    forming a first epitaxial layer and a second epitaxial layer stacked on the first epitaxial layer in each channel hole, the first epitaxial layer being configured to form a source region or a drain region;
    forming a sacrificial layer on the first insulating layer and exposing the second epitaxial layer relative to the sacrificial layer, forming another first epitaxial layer stacking on the second epitaxial layer; forming a second insulating layer on the sacrificial layer and exposing the another first epitaxial layer relative to the second insulating layer, and forming another second epitaxial layer stacking on the another first epitaxial layer;
    repeating previous steps to totally form a plurality of sacrificial layers and a plurality of second insulating layers alternately stacked on the first insulating layer, and totally form a plurality of first epitaxial layers and a plurality of second epitaxial layers alternately stacked on the substrate.

2. The method of claim 1, wherein forming each of the plurality of first epitaxial layers comprises forming an N-type unevenly doped semiconductor material layer; forming each of the plurality of second epitaxial layers comprises forming an N-type or P-type lightly doped semiconductor material layer.

3. The method of claim 2, wherein forming each of the plurality of first epitaxial layers comprises:
    orderly forming a P-type lightly doped first semiconductor material layer, an N-type heavily doped second semiconductor material layer, and a P-type lightly doped third semiconductor material layer one by one, wherein the N-type heavily doped second semiconductor material layer is between the P-type lightly doped first semiconductor material layer and the P-type lightly doped third semiconductor material layer;
    an N-type dopant of the N-type heavily doped second semiconductor material layer diffusing to both the P-type lightly doped first semiconductor material layer and the P-type lightly doped third semiconductor material layer.

4. The method of claim 2, wherein forming each of the plurality of first epitaxial layers comprises:
    orderly forming an N-type lightly doped first semiconductor material layer, an N-type heavily doped second semiconductor material layer, and an N-type lightly doped third semiconductor material layer one by one, wherein the N-type heavily doped second semiconductor material layer is between the N-type lightly doped first semiconductor material layer and the N-type lightly doped third semiconductor material layer;
    an N-type dopant of the N-type heavily doped second semiconductor material layer diffused to both the N-type lightly doped first semiconductor material layer and the N-type lightly doped third semiconductor material layer.

5. The method of claim 1, wherein forming each of the plurality of first epitaxial layers comprises forming a P-type unevenly doped semiconductor material layer; forming each of the plurality of second epitaxial layers comprises forming an N-type or P-type lightly doped semiconductor material layer.

6. The method of claim 5, wherein forming each of the plurality of first epitaxial layers comprises:
    orderly forming an N-type lightly doped first semiconductor material layer, a P-type heavily doped second semiconductor material layer, and an N-type lightly doped third semiconductor material layer one by one, wherein the P-type heavily doped second semiconductor material layer is between the N-type lightly doped first semiconductor material layer and the N-type lightly doped third semiconductor material layer;
    a P-type dopant of the P-type heavily doped second semiconductor material layer diffusing to both the N-type lightly doped first semiconductor material layer and the N-type lightly doped third semiconductor material layer.

7. The method of claim 5, wherein forming each of the plurality of first epitaxial layers comprises:
    orderly forming a P-type lightly doped first semiconductor material layer, a P-type heavily doped second semiconductor material layer, and a P-type lightly doped third semiconductor material layer one by one, wherein the P-type heavily doped second semiconductor material layer is between the P-type lightly doped first semiconductor material layer and the P-type lightly doped third semiconductor material layer;
    a P-type dopant of the P-type heavily doped second semiconductor material layer diffusing to both the P-type lightly doped first semiconductor material layer and the P-type lightly doped third semiconductor material layer.

8. The method of claim 1, wherein forming the sacrificial layer on the first insulating layer comprises:
    depositing the sacrificial layer on the first insulating layer to cover the second epitaxial layer;
    flattening the sacrificial layer to expose the second epitaxial layer to the sacrificial layer.

9. The method of claim 8, wherein forming one of the plurality of sacrificial layers on one of the plurality of second insulating layers comprises:
    depositing the sacrificial layer on the corresponding one of the plurality of second insulating layers to cover the second epitaxial layer;
    flattening the sacrificial layer to expose the second epitaxial layer to the sacrificial layer.

10. The method of claim 9, wherein forming each of the plurality of second insulating layers on one of the plurality of sacrificial layers comprises:

depositing one of the plurality of second insulating layers on the corresponding one of the plurality of sacrificial layers to cover the first epitaxial layer;

flattening the corresponding one of the plurality of second insulating layers to expose the first epitaxial layer to the corresponding one of the plurality of second insulating layers.

11. The method of claim 1, further comprising: defining a gate hole in the plurality of second insulating layers and the plurality of sacrificial layers,
wherein the gate hole extends through the plurality of second insulating layers and the plurality of sacrificial layers and exposes the first insulating layer;
removing the plurality of sacrificial layers and filling conductive material in the gate hole and region previously occupied by the plurality of sacrificial layers to form a gate.

12. The method of claim 11, wherein after removing the plurality of sacrificial layers and before forming the gate, the method further comprises:
forming a gate channel by removing the plurality of sacrificial layers, and
conformally forming a dielectric layer on sidewalls of both the first insulating layer and the plurality of second insulating layers contacting with the gate channel and the gate hole.

13. The method of claim 1, wherein each of the plurality of first epitaxial layers and each of the plurality of second epitaxial layers are formed by selective epitaxial growth process; an etching rate of each of the plurality of first epitaxial layers is higher than etching rates of the first insulating layer and each of the plurality of second epitaxial layers under the same etching conditions.

* * * * *